United States Patent
Niwa et al.

(10) Patent No.: US 11,705,538 B2
(45) Date of Patent: Jul. 18, 2023

(54) SEMICONDUCTOR LIGHT EMITTING ELEMENT

(71) Applicant: NIKKISO CO., LTD., Tokyo (JP)

(72) Inventors: Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 17/533,217

(22) Filed: Nov. 23, 2021

(65) Prior Publication Data

US 2022/0085242 A1 Mar. 17, 2022

Related U.S. Application Data

(62) Division of application No. 16/846,706, filed on Apr. 13, 2020, now Pat. No. 11,227,976.

(30) Foreign Application Priority Data

Apr. 17, 2019 (JP) .................................. 2019-078383

(51) Int. Cl.
*H01L 33/32* (2010.01)
*H01L 33/00* (2010.01)
(Continued)

(52) U.S. Cl.
CPC .......... *H01L 33/32* (2013.01); *H01L 33/0075* (2013.01); *H01L 33/36* (2013.01);
(Continued)

(58) Field of Classification Search
CPC ..... H01L 33/36; H01L 33/0075; H01L 33/56; H01L 33/44; H01L 33/32; H01L 33/007; H01L 33/20; H01L 33/54; H01L 2933/005
See application file for complete search history.

(56) References Cited

U.S. PATENT DOCUMENTS

| 8,492,186 B2 | 7/2013 | Shinohara et al. |
| 11,355,670 B2 * | 6/2022 | Sakai ...................... H01L 33/44 |

(Continued)

FOREIGN PATENT DOCUMENTS

| JP | 2002344015 A | 11/2002 |
| JP | 2005286098 A | 10/2005 |

(Continued)

OTHER PUBLICATIONS

Office Action of TW Application No. 109112894 and English translation, dated Jan. 7, 2021, 10 pages.

(Continued)

*Primary Examiner* — Savitri Mulpuri
(74) *Attorney, Agent, or Firm* — Muncy, Geissler, Olds & Lowe, P.C.

(57) ABSTRACT

A semiconductor light emitting element includes: an n-type semiconductor layer made of an n-type aluminum gallium nitride (AlGaN)-based semiconductor material provided on a substrate; an active layer made of an AlGaN-based semiconductor material provided on the n-type semiconductor layer; a p-type semiconductor layer provided on the active layer; and a covering layer made of a dielectric material that covers the n-type semiconductor layer, the active layer, and the p-type semiconductor layer. Each of the active layer and the p-type semiconductor layer has a sloped surface that is sloped at a first angle with respect to the substrate and is covered by the covering layer. The n-type semiconductor layer has a sloped surface that is sloped at a second angle larger than the first angle with respect to the substrate and is covered by the covering layer.

4 Claims, 7 Drawing Sheets

(51) Int. Cl.
*H01L 33/56* (2010.01)
*H01L 33/54* (2010.01)
*H01L 33/36* (2010.01)
*H01L 33/44* (2010.01)

(52) U.S. Cl.
CPC .............. *H01L 33/44* (2013.01); *H01L 33/54* (2013.01); *H01L 33/56* (2013.01); *H01L 2933/005* (2013.01)

(56) References Cited

U.S. PATENT DOCUMENTS

| | | |
|---|---|---|
| 2005/0152419 A1 | 7/2005 | Kishimoto et al. |
| 2008/0013581 A1 | 1/2008 | Kobayashi |
| 2012/0012869 A1 | 1/2012 | Song |
| 2015/0349208 A1 | 12/2015 | Kim et al. |
| 2020/0066941 A1 | 2/2020 | Niwa et al. |
| 2021/0036187 A1* | 2/2021 | Lee .......................... H01L 33/20 |

FOREIGN PATENT DOCUMENTS

| | | |
|---|---|---|
| JP | 2006191068 A | 7/2006 |
| JP | 2009164506 A | 7/2009 |
| JP | 2017-204568 A | 11/2017 |
| KR | 20140038785 A | 3/2014 |
| KR | 20180094751 A | 8/2018 |
| KR | 20190038104 A | 4/2019 |

OTHER PUBLICATIONS

Office Action of JP Application No. 2019-078383 and English translation, dated Nov. 24, 2020, 5 pages.

Baik et al., "Light output enhancement of GaN-based flip-chip light-emitting diodes fabricated with SiO2/TiO2 distributed Bragg reflector coated on mesa sidewall," Journal of Applied Physics 108, 2010, 5 pages.

An Office Action in corresponding JP Application No. 2019078383 dated Nov. 18, 2022 is attached, 20 pages and its machine generated English translation, 9 pages.

Office Action dated May 6, 2022 in JP Application No. 2019-078383, 21 pages, w/English translation.

* cited by examiner

SEMICONDUCTOR LIGHT EMITTING ELEMENT

RELATED APPLICATION

This application is a Division of co-pending application Ser. No. 16/846,706, filed on Apr. 13, 2020, which claims priority of Application No. 2019-078383 filed in Japan on Apr. 17, 2019 under 35 U.S.C. § 119, the entire contents of all of which are hereby incorporated by reference.

BACKGROUND OF THE INVENTION

1. Field of the Invention

The present invention relates to a semiconductor light emitting element.

2. Description of the Related Art

A light emitting element for emitting deep ultraviolet light includes an aluminum gallium nitride (AlGaN)-based n-type clad layer, an active layer, and a p-type clad layer stacked successively on a substrate. The p-side clad layer and the active layer are etched to expose a partial region in the n-type clad layer, and a mesa surface sloped with respect to the substrate is formed. The sloped mesa surface is covered by a protective layer of silicon oxide ($SiO_2$), etc.

It is preferred that a highly reliable covering layer be provided on the surface of the semiconductor light emitting element.

SUMMARY OF THE INVENTION

The present invention addresses the above-described issue, and an illustrative purpose thereof is to improve the reliability of a semiconductor light emitting element.

The semiconductor light emitting element according to an embodiment of the present invention includes: an n-type semiconductor layer made of an n-type aluminum gallium nitride (AlGaN)-based semiconductor material provided on a substrate; an active layer made of an AlGaN-based semiconductor material provided on the n-type semiconductor layer; and a p-type semiconductor layer provided on the active layer; and a covering layer made of a dielectric material that covers the n-type semiconductor layer, the active layer, and the p-type semiconductor layer. Each of the active layer and the p-type semiconductor layer has a sloped surface that is sloped at a first angle with respect to the substrate and is covered by the covering layer. The n-type semiconductor layer has a sloped surface that is sloped at a second angle larger than the first angle with respect to the substrate and is covered by the covering layer.

According to the embodiment, by providing the covering layer that covers the sloped surface of each of the n-type semiconductor layer, the active layer, and the p-type semiconductor layer, in which an electric current flows during light emission, degradation of these layers can be suitably prevented. By providing the sloped surface of the n-type semiconductor layer instead of a perpendicular surface, the stress applied to the covering layer can be mitigated. By providing a relatively large angle of the sloped surface of the n-type semiconductor layer, the active layer formed on the n-type semiconductor layer is capable to have a relatively large area, and then the light emission efficiency per a unit area of the substrate can be enhanced.

The first angle may be not less than 40 degrees and less than 55 degrees. The second angle may be not less than 55 degrees and less than 70 degrees.

A thickness of a portion of the n-type semiconductor layer sloped at the second angle may be larger than a total thickness of portions of the active layer and the p-type semiconductor layer sloped at the first angle.

The semiconductor light emitting element may further include: a base layer made of the AlGaN-based semiconductor material provided between the substrate and the n-type semiconductor layer and having an n-type impurity concentration of $5 \times 10^{17}$ $cm^{-3}$ or lower. The base layer may have a sloped surface that is sloped at the second angle with respect to the substrate and is covered by the covering layer.

The covering layer may not overlap the base layer in a direction of thickness at an outer circumference of the base layer.

Another embodiment of the present invention relates to a method of manufacturing a semiconductor light emitting element. The method includes: forming an n-type semiconductor layer made of an n-type aluminum gallium nitride (AlGaN)-based semiconductor material, an active layer made of an AlGaN-based semiconductor material, and a p-type semiconductor layer successively; forming a first resin resist on a part of the p-type semiconductor layer, the first resin resist having a first side surface sloped with respect to the substrate; dry-etching the p-type semiconductor layer and the active layer from above the first resin resist to expose the n-type semiconductor layer in a region not overlapping the first resin resist and to form a sloped surface in each of the p-type semiconductor layer and the active layer at the first angle with respect to the substrate; forming a second resin resist on the p-type semiconductor layer, the active layer, and the exposed n-type semiconductor layer, the second resin resist having a second side surface sloped with respect to the substrate, and an angle of the second side surface being larger than an angle of the first side surface; dry-etching the n-type semiconductor layer from above the second resin resist to remove the n-type semiconductor layer in a region not overlapping the second resin resist and to form a sloped surface in the n-type semiconductor layer at a second angle larger than the first angle with respect to the substrate; and forming a covering layer made of a dielectric material that covers the sloped surface of each of the p-type semiconductor layer, the active layer, and the n-type semiconductor layer.

According to the embodiment, by providing the covering layer that covers the sloped surface of each of the n-type semiconductor layer, the active layer, and the p-type semiconductor layer, in which an electric current flows during light emission, degradation of these layers can be suitably prevented. By providing the sloped surface of the n-type semiconductor layer instead of a perpendicular surface, the stress applied to the covering layer can be mitigated. By providing a relatively large angle of the sloped surface of the n-type semiconductor layer, the active layer formed on the n-type semiconductor layer is capable to have a relatively large area, and then the light emission efficiency per a unit area of the substrate can be enhanced.

The method may further include: forming an n-side contact electrode on the exposed n-type semiconductor layer; and forming a p-side contact electrode on the p-type semiconductor layer formed with the sloped surface. The covering layer may be formed to further cover the n-side contact electrode and the p-side contact electrode.

The method may further include: forming a base layer between the substrate and the n-type semiconductor layer, the base layer being made of an AlGaN-based semiconductor material and having an n-type impurity concentration of $5 \times 10^{17}$ cm$^{-3}$ or lower. The dry-etching the n-type semiconductor layer from above the second resin resist may include exposing the base layer in a region not overlapping the second resin resist and forming a sloped surface in the base layer at the second angle with respect to the substrate. The covering layer may be formed to further cover the sloped surface of the base layer, avoiding an isolation region defined on an upper surface of the exposed base surface such that the isolation encircles an outer circumference of the sloped surface of the base layer.

The method may further include: cutting the substrate and the base layer off in the isolation region into individual pieces.

An etching depth of the dry-etching from above the second resin resist may be larger than an etching depth of the dry-etching from above the first resin resist.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
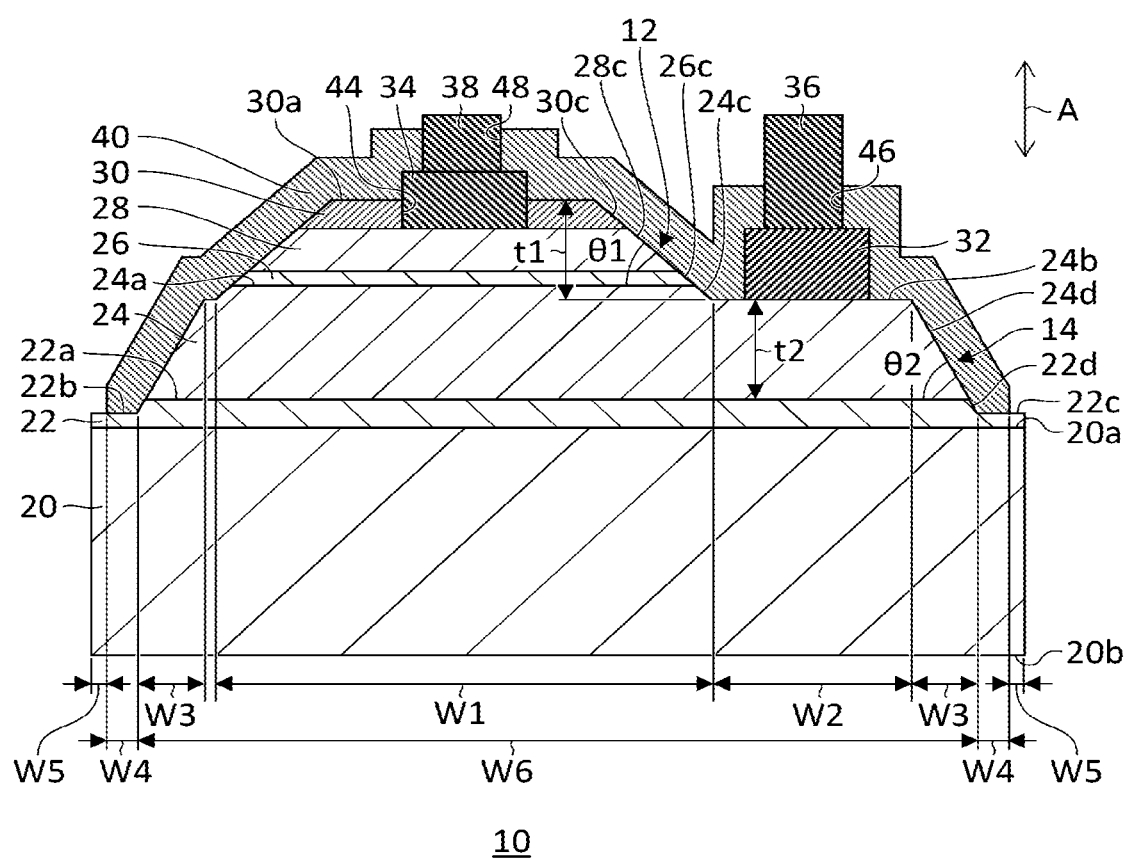
FIG. 1 is a cross-sectional view schematically showing a configuration of a semiconductor light emitting element according to the embodiment.

The invention will now be described by reference to the preferred embodiments. This does not intend to limit the scope of the present invention, but to exemplify the invention.

A detailed description will be given of an embodiment to practice the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light emitting element.

The embodiment relates to a semiconductor light emitting element configured to emit "deep ultraviolet light" having a central wavelength λ of about 360 nm or shorter and is a so-called deep ultraviolet-light emitting diode (UV-LED). To output deep ultraviolet light having such a wavelength, an aluminum gallium nitride (AlGaN)-based semiconductor material having a band gap of about 3.4 eV or larger is used. In the embodiment, emission of deep ultraviolet light having a central wavelength λ of about 240 nm-350 nm is discussed.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 < x+y \leq 1$, $0 < x < 1$, $0 < y < 1$). The AlGaN-based semiconductor material shall encompass aluminum gallium nitride (AlGaN) or indium aluminum gallium nitride (InAlGaN). The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" contain GaN or InGaN. Similarly, those materials that do not contain GaN may be distinguished by referring to them as "AlN-based semiconductor materials". "AlN-based semiconductor materials" contain AlN or InAlN.

FIG. 1 is a cross-sectional view schematically showing a configuration of a semiconductor light emitting element 10 according to the embodiment. The semiconductor light emitting element 10 includes a substrate 20, a base layer 22, an n-type semiconductor layer 24, an active layer 26, a p-type semiconductor layer 28, a protective layer 30, an n-side contact electrode 32, a p-side contact electrode 34, an n-side pad electrode 36, a p-side pad electrode 38, and a covering layer 40.

Referring to FIG. 1, the direction indicated by the arrow A may be referred to as "vertical direction" or "direction of thickness". In a view of the substrate 20, the direction away from the substrate 20 may be referred to as upward, and the direction toward the substrate 20 may be referred to as downward. The direction orthogonal to the arrow A may be referred to as "lateral direction" or "horizontal direction". Regarding the lateral direction, the direction toward a center of the light emitting element 10 may be referred as inward, and the direction away from the center of the light emitting element 10 may be referred as outward.

The substrate 20 is a substrate having translucency for the deep ultraviolet light emitted by the semiconductor light emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the layers from the base layer 22 to the p-type semiconductor layer 28. The second principal surface 20b is a principal surface that is a light extraction surface for extracting the deep ultraviolet light emitted by the active layer 26 outside. In an embodiment, the substrate 20 may be an aluminum nitride (AlN) substrate or an aluminum gallium nitride (AlGaN) substrate.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature AlN) layer grown at a high temperature. The base layer 22 may include an undoped AlGaN layer formed on the AlN layer. In an embodiment, the base layer 22 may be comprised only of an undoped AlGaN layer when the substrate 20 is an AlN substrate or an AlGaN substrate. In other words, the base layer 22 includes at least one of an undoped AlN layer and an undoped AlGaN layer.

The base layer 22 is configured such that the concentration of an n-type impurity such as silicon (Si) is equal to or lower than $5\times10^{17}$ cm$^{-3}$ and is configured not to contribute to conduction when electrons are injected from the n-side contact electrode 32 toward the active layer 26. In other words, the base layer 22 has a lower n-type impurity concentration than the n-type semiconductor layer 24 described later and so has a lower conductivity (i.e., a higher resistivity).

The base layer 22 includes a first upper surface 22a, a second upper surface 22b, and a sloped surface 22d. The first upper surface 22a and the second upper surface 22b are surfaces substantially parallel to the first principal surface 20a of the substrate 20 and are oriented in the direction of thickness (upward in FIG. 1) of the substrate 20. The second upper surface 22b is positioned outside the first upper surface 22a in the lateral direction and has a height different from a height of the first upper surface 22a. The height (or thickness) from the first principal surface 20a of the substrate 20 to the second upper surface 22b of the base layer 22 is smaller than the height (or thickness) from the first principal surface 20a of the substrate 20 to the first upper surface 22a of the base layer 22. The sloped surface 22d is provided between the first upper surface 22a and the second upper surface 22b and is sloped at a second angle θ2 with respect to the first principal surface 20a of the substrate 20.

The n-type semiconductor layer 24 is provided on the first upper surface 22a of the base layer 22. The n-type semiconductor layer 24 is an n-type AlGaN-based semiconductor material layer. For example, the n-type semiconductor layer 24 is an AlGaN layer doped with silicon (Si) as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferable to form the n-type semiconductor layer 24 such that the molar fraction of AlN is 80% or lower, i.e., the band gap is 5.5 eV or smaller. It is more preferable to form the n-type semiconductor layer 24 such that the molar fraction of AlN is 70% or lower (i.e., the band gap is 5.2 eV or smaller). The n-type semiconductor layer 24 has a thickness of about 1 µm-3 µm. For example, the n-type semiconductor layer 24 has a thickness of about 2 µm.

The n-type semiconductor layer 24 is formed such that the concentration of silicon (Si) as the impurity is not lower than $1\times10^{18}$/cm$^3$ and not higher than $5\times10^{19}$/cm$^3$. It is preferred to form the n-type semiconductor layer 24 such that the Si concentration is not lower than $5\times10^{18}$/cm$^3$ and not higher than $3\times10^{19}$/cm$^3$, and, preferably, not lower than $7\times10^{18}$/cm$^3$ and not higher than $2\times10^{19}$/cm$^3$. In an embodiment, the Si concentration in the n-type semiconductor layer 24 is around $1\times10^{19}$/cm$^3$ and is in a range not lower than $8\times10^{18}$/cm$^3$ and not higher than $1.5\times10^{19}$/cm$^3$.

The n-type semiconductor layer 24 includes a first upper surface 24a, a second upper surface 24b, a first sloped surface 24c, and a second sloped surface 24d. The first upper surface 24a and the second upper surface 24b are surfaces substantially parallel to the first principal surface 20a of the substrate 20 and are oriented in the direction of thickness (upward in FIG. 1) of the substrate 20. The first upper surface 24a and the second upper surface 24b may have different heights, and the height from the substrate 20 to the first upper surface 24a is larger than the height from the substrate 20 to the second upper surface 24b. The first sloped surface 24c is provided to encircle the first upper surface 24a from outside in the lateral direction and is sloped at a first angle θ1 with respect to the first principal surface 20a of the substrate 20. The second sloped surface 24d is provided to encircle the second upper surface 24b from outside in the lateral direction and is sloped at a second angle θ2 with respect to the first principal surface 20a of the substrate 20.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 includes a sloped surface 26c sloped at the first angle θ1 with respect to the first principal surface 20a of the substrate 20. The thickness of the active layer 26 is, for example, 100 nm or smaller or 50 nm or smaller.

For example, the active layer 26 has a monolayer or multilayer quantum well structure and is comprised of stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. The barrier layer and the well layer has a thickness of about 1 nm-20 nm, and has a thickness of, for example, about 2 nm-10 nm.

The active layer 26 may further include an electron blocking layer directly in contact with the p-type semiconductor layer 28. The electron blocking layer is an undoped AlGaN-based semiconductor material layer and is formed such that the molar fraction of AlN is 40% or higher, and, preferably, 50% or higher. The electron blocking layer may be formed such that the molar fraction of AlN is 80% or higher or may be made of an AlN-based semiconductor material that does not substantially contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is a p-type AlGaN-based semiconductor material layer. For example, the p-type semiconductor layer 28 is an AlGaN layer doped with magnesium (Mg) as a p-type impurity. The p-type semiconductor layer 28 has a thickness of about 300 nm-700 nm, and has a thickness of, for example, about 400 nm-600 nm. The p-type semiconductor layer 28 may be made of a p-type GaN-based semiconductor material that does not substantially contain AlN. The p-type semiconductor layer 28 includes a sloped surface 28c sloped at the first angle θ1 with respect to the first principal surface 20a of the substrate 20.

The protective layer 30 is provided on the p-type semiconductor layer 28. The protective layer 30 is made of silicon oxide ($SiO_2$) or silicon oxynitride (SiON). The thickness of the protective layer 30 is 50 nm or larger. For example, the thickness may be not less than 100 nm and not more than 500 nm. The protective layer 30 includes an upper surface 30a and a sloped surface 30c. The sloped surface 30c is sloped at the first angle θ1 with respect to the first principal surface 20a of the substrate 20. A first p-side opening 44 for forming the p-side contact electrode 34 is provided in the protective layer 30. The first p-side opening 44 is provided on the p-type semiconductor layer 28 and is formed to extend through the protective layer 30 to expose the p-type semiconductor layer 28.

The protective layer 30 is made of a material having a lower refractive index for the deep ultraviolet light output from the active layer 26 than the p-type semiconductor layer 28. The refractive index of the AlGaN-based semiconductor material forming the p-type semiconductor layer 28 depends on the composition ratio and is about 2.1-2.56. Meanwhile, the refractive index of $SiO_2$ forming the protective layer 30 is about 1.4, and the refractive index of SiON is about 1.4-2.1. By providing the protective layer 30 having a low refractive index, a larger portion of the ultraviolet light from the active layer 26 can be totally reflected at the interface between the p-type semiconductor layer 28 and the protective layer 30 and guided toward the second principal surface 20b of the substrate 20 that is the light extraction surface. In the case of silicon oxide ($SiO_2$), in particular, the refractive index difference from the p-type semiconductor layer 28 is larger so that the reflection characteristic is further improved.

The n-side contact electrode 32 is provided on the second upper surface 24b of the n-type semiconductor layer 24. The n-side contact electrode 32 is provided in a second region W2 different from a first region W1 in which the active layer 26 is provided. The n-side contact electrode 32 includes a titanium (Ti) layer directly in contact with the n-type semiconductor layer 24 and an aluminum (Al) layer directly in contact with the Ti layer. The thickness of the Ti layer is about 1 nm-10 nm and is preferably 5 nm or smaller, and, more preferably, 2 nm or smaller. By configuring the Ti layer to have a small thickness, the ultraviolet reflectivity of the n-side contact electrode 32 as viewed from the n-type semiconductor layer 24 is enhanced. The thickness of the Al layer is about 100 nm-1000 nm and is preferably 200 nm or larger, and, more preferably, 300 nm or larger. By configuring the Al layer to have a large thickness, the ultraviolet reflectivity of the n-side contact electrode 32 is enhanced. The n-side contact electrode 32 functions as a reflection electrode that reflects the ultraviolet light from the n-type semiconductor layer 24 and directs the light toward the second principal surface 20b of the substrate 20. It is preferred that the n-side contact electrode 32 does not contain gold (Au), which could cause reduction in the ultraviolet reflectivity.

The p-side contact electrode 34 is provided on the p-type semiconductor layer 28. The p-side contact electrode 34 is directly in contact with the p-type semiconductor layer 28 via a first p-side opening 44 that extends through the protective layer 30. The p-side contact electrode 34 is made of a transparent conductive oxide (TCO) such as tin oxide ($SnO_2$), zinc oxide (ZnO), and indium tin oxide (ITO). The thickness of the p-side contact electrode 34 is about 20 nm-500 nm and is preferably 50 nm or larger, and, more preferably, 100 nm or larger.

The n-side pad electrode 36 and the p-side pad electrode 38 (generically referred to as pad electrodes) are portions bonded when the semiconductor light emitting element 10 is mounted on a package substrate or the like. The n-side pad electrode 36 is provided on the n-side contact electrode 32 and is electrically connected to the n-side contact electrode 32 via an n-side opening 46 that extends through the covering layer 40. The p-side pad electrode 38 is provided on the p-side contact electrode 34 and is electrically connected to the p-side contact electrode 34 via a second p-side opening 48 that extends through the covering layer 40.

From the perspective of providing resistance to corrosion, the pad electrodes 36, 38 are configured to contain gold (Au). For example, the pad electrodes 36, 38 are formed by a stack structure of nickel (Ni)/Au, titanium (Ti)/Au, or Ti/platinum (Pt)/Au. In the case the pad electrodes 36, 38 are bonded by gold-tin (AuSn), an AuSn layer embodying the metal joining member may be included in the pad electrodes 36, 38.

The covering layer 40 is made of a dielectric material such as silicon oxide ($SiO_2$) and aluminum oxide ($Al_2O_3$). The covering layer 40 is made of $SiO_2$ in one example. The thickness of the covering layer 40 is, for example, 100 nm or larger and is 200 nm or larger, 300 nm or larger, or 500 nm or larger. The thickness of the covering layer 40 is, for example, 2 μm or smaller, 1 μm or smaller, or 800 nm or smaller. By configuring the covering layer 40 to have a large thickness, the surfaces of the respective layers formed on the first principal surface 20a of the substrate 20 are suitably covered.

The covering layer 40 covers at least a first mesa surface 12 and a second mesa surface 14 of the semiconductor light emitting element 10. The first mesa surface 12 is sloped at the first angle θ1 with respect to the substrate 20 and is comprised of the first sloped surface 24c of the n-type semiconductor layer 24, the sloped surface 26c of the active layer, 26, the sloped surface 28c of the p-type semiconductor layer 28, and the sloped surface 30c of the protective layer 30. The second mesa surface 14 is sloped at the second angle θ2 with respect to the substrate 20 and is comprised of the second sloped surface 24d of the n-type semiconductor layer 24, and the sloped surface 22d of the base layer 22.

The first angle θ1 at which the first mesa surface 12 is sloped is not less than 40 degrees and less than 50 degrees and is, for example, about 45 degrees-50 degrees. The second angle θ2 of slope of the second mesa surface 14 is larger than the first angle θ1, is not less than 55 degrees and less than 70 degrees, and is, for example, about 60 degrees-65 degrees. A thickness t2 of the portion in which the second mesa surface 14 is formed is larger than a thickness t1 of the portion in which the first mesa surface 12 is formed. The thickness t2 of the portion in which the second mesa surface 14 is formed is nearly equal to the thickness of the n-type semiconductor layer 24 and is, for example, about 1 μm-3 μm. The thickness t1 of the portion in which the first mesa surface 12 is formed is nearly equal to the total thicknesses of the active layer 26, the p-type semiconductor layer 28, and the protective layer 30 and is, for example, about 0.5 μm-1.5 μm.

The covering layer 40 further covers the second upper surface 24b of the n-type semiconductor layer 24, the upper surface 30a of the protective layer 30, the n-side contact electrode 32, and the p-side contact electrode 34. The covering layer 40 further covers a fourth region W4 that is a portion of the second upper surface 22b of the base layer 22. The covering layer 40 is not provided in a fifth region W5 in the laterally outermost portion of the semiconductor light emitting element 10. Therefore, the covering layer 40 is provided so as not to overlap the base layer 22 in the direction of thickness at the outer circumference of the base layer 22.

Figure 2:
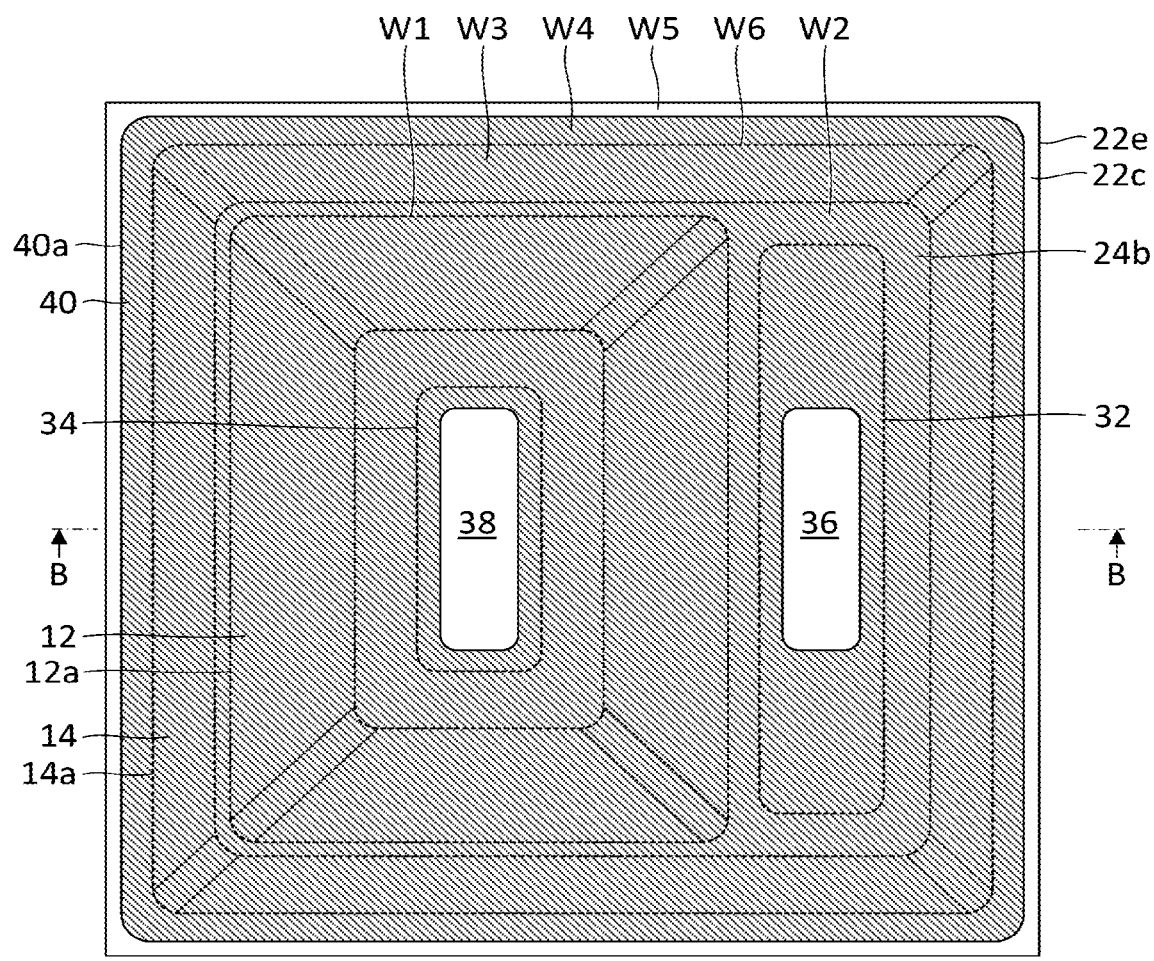
FIG. 2 is a schematic top view showing a configuration of the semiconductor light emitting element according to the embodiment.

FIG. 2 is a schematic top view showing a configuration of the semiconductor light emitting element 10 according to the embodiment. FIG. 1 described above corresponds to a B-B cross section of FIG. 2. The first region W1 is a region inward of an outer circumference 12a of the first mesa surface 12. The entirety of the first region W1 except for the p-side pad electrode 38 is covered by the covering layer 40. The second region W2 is a region occupied by the second upper surface 24b of the n-type semiconductor layer 24. The entirety of the second region W2 except for the n-side pad electrode 36 is covered by the covering layer 40. A third region W3 is a region occupied by the second mesa surface 14, and the entirety of the third region W3 is covered by the covering layer 40.

The fourth region W4 is a frame-shaped region adjacent to an outer circumference 14a of the second mesa surface 14 and is a region of the second upper surface 22b of the base layer 22 covered by the covering layer 40. The fifth region W5 is a region of the second upper surface 22b of the base layer 22 not covered by the covering layer 40. Referring to the plan view of FIG. 2, the fifth region W5 in which the covering layer 40 is not formed is provided adjacent to the entirety of an outer circumference 40a of the covering layer 40. The outer circumference 40a of the covering layer 40 is located inward of an outer circumference 22e of the base layer 22. Between the outer circumference 22e of the base layer 22 and the outer circumference 40a of the covering layer 40 is provided a clearance for providing an outer circumferential surface 22c not overlapping the covering layer 40.

Figure 3:
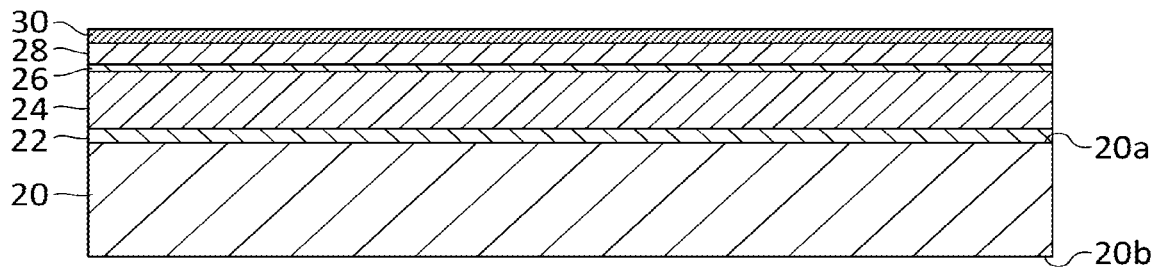
FIG. 3 schematically shows a step of manufacturing the semiconductor light emitting element.

A description will now be given of a method of manufacturing the semiconductor light emitting element 10. FIGS. 3-13 schematically show the steps of manufacturing the semiconductor light emitting element 10 and show the steps of manufacturing two semiconductor light emitting elements from one substrate. Referring to FIG. 3, the base layer 22, the n-type semiconductor layer 24, the active layer 26, the p-type semiconductor layer 28, and the protective layer 30 are first formed on the first principal surface 20a of the substrate 20 successively.

The substrate 20 is a sapphire ($Al_2O_3$) substrate and is a growth substrate for forming an AlGaN-based semiconductor material. For example, the base layer 22 is formed on the (0001) plane of the sapphire substrate. The base layer 22 includes, for example, an AlN (HT-AlN) layer grown at a high temperature and an undoped AlGaN (u-AlGaN) layer. The n-type semiconductor layer 24, the active layer 26, and the p-type semiconductor layer 28 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxial (MBE) method.

The protective layer 30 is made of $SiO_2$ or SiON and can be formed by a well-known technology such as chemical vapor deposition (CVD).

Figure 4:
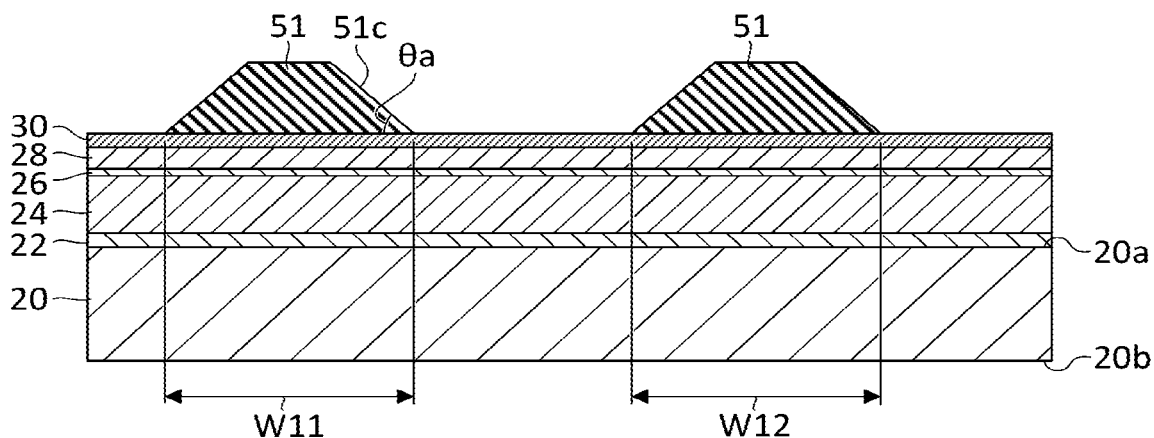
FIG. 4 schematically shows a step of manufacturing the semiconductor light emitting element.

A first resin resist 51 is then formed on the protective layer 30 as shown in FIG. 4. The first resin resist 51 is an etching mask for forming the first mesa surface 12 of FIG. 1. The first resin resist 51 is provided in regions W11, W12 corresponding to the first region W1 of FIG. 1. A first side surface 51c of the first resin resist 51 is sloped at a predetermined slope angle θa with respect to the substrate 20. The slope angle θa of the first side surface 51c of the first resin resist 51 is defined such that the first mesa surface 12 at the first angle θ1 is formed in the subsequent etching step.

The slope angle θa of the first side surface 51c of the first resin resist 51 is adjustable by controlling the post-baking temperature for the resist resin. For example, by using a lower post-baking temperature for the resist resin, the slope angle θa of the first side surface 51c can be increased. By using a higher post-baking temperature for the resist resin, the slope angle θa of the first side surface 51c can be decreased. For example, the slope angle θa of the first side surface 51c of the first resin resist 51 can be defined between 80 degrees-20 degrees by adjusting the post-baking temperature between 100° C.-200° C.

Figure 5:
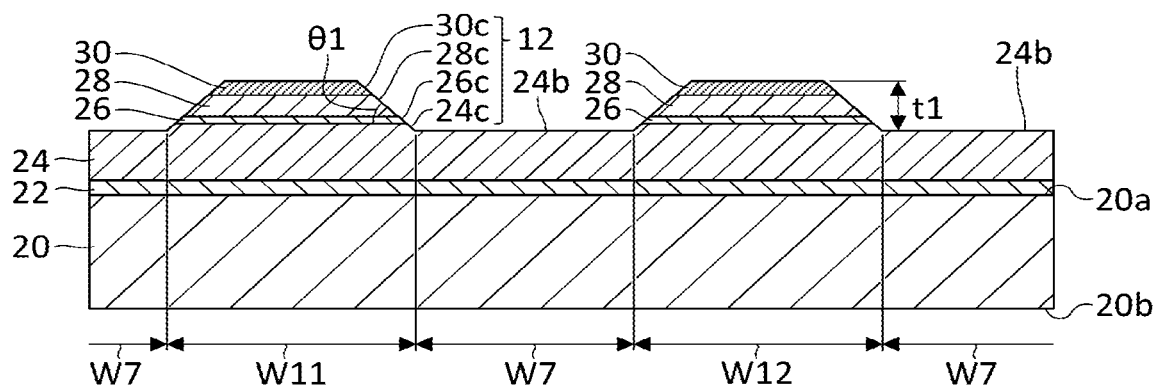
FIG. 5 schematically shows a step of manufacturing the semiconductor light emitting element.

Subsequently, as shown in FIG. 5, the n-type semiconductor layer 24 in a seventh region W7 not overlapping the first resin resist 51 (i.e., a region different from the regions W11, W12) is exposed by dry-etching the protective layer 30, the p-type semiconductor layer 28, and the active layer 26 from above the first resin resist 51. In this way, the second upper surface 24b of the n-type semiconductor layer 24 is formed. Further, the first mesa surface 12 sloped at the first angle θ1 is formed in the regions W11, W12 overlapping the first resin resist 51. The first mesa surface 12 is comprised of the first sloped surface 24c of the n-type semiconductor layer 24, the sloped surface 26c of the active layer, 26, the sloped surface 28c of the p-type semiconductor layer 28, and the sloped surface 30c of the protective layer 30. For example, reactive ion etching using an etching gas turned into a plasma can be used in the step of forming the first mesa surface 12. For example, inductive coupling plasma (ICP) etching may be used. An etching depth t1 in the step of dry-etching from above the first resin resist 51 to form the first mesa surface 12 is, for example, about 0.5 μm-1.5 μm.

Figure 6:
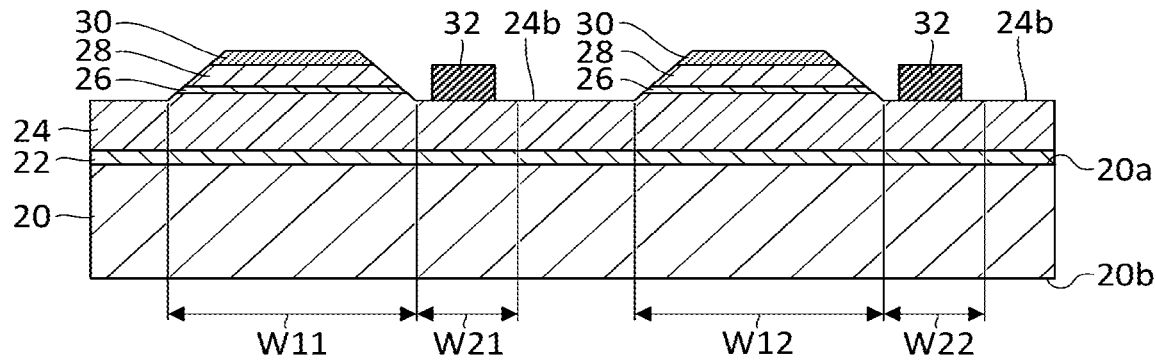
FIG. 6 schematically shows a step of manufacturing the semiconductor light emitting element.

As shown in FIG. 6, the n-side contact electrode 32 is then formed on the second upper surface 24b of the n-type semiconductor layer 24. The n-side contact electrode 32 is formed in regions W21, W22 corresponding to the second region W2 of FIG. 1. The n-side contact electrode 32 can be formed by forming a Ti layer on the second upper surface 24b of the n-type semiconductor layer 24 and then forming an Al layer on the Ti layer. It is preferred to form the Ti layer and the Al layer of the n-side contact electrode 32 by sputtering. These layers can be formed by electron beam (EB) deposition, but sputtering can form a metal layer having a low film density and realize a more suitable contact resistance at a relatively low anneal temperature.

The n-side contact electrode 32 is then annealed. The n-side contact electrode 32 is annealed at a temperature below the melting point of Al (about 660° C.). It is preferred to anneal the n-side contact electrode 32 at a temperature not lower than 560° C. and not higher than 650° C. The film density of the Al layer of less than 2.7 $g/cm^3$ and the anneal temperature of not lower than 560° C. and not higher than 650° C. ensure that the contact resistance of the n-side contact electrode 32 is 0.1 $\Omega \cdot cm^2$ or lower. The anneal temperature of not lower than 560° C. and not higher than 650° C. enhances the post-annealing flatness of the n-side contact electrode 32 and provides a ultraviolet reflectivity of 30% or higher. Further, a suitable contact resistance is obtained also by annealing for one minute or longer (e.g., about five minutes-thirty minutes) by annealing at a temperature below the melting point of Al. In the case a plurality of element portions are formed on one substrate, securing a long anneal time (one minute or more) makes it possible to enhance temperature uniformity in the substrate during annealing and to allow a plurality of semiconductor light emitting elements with little characteristic variation to be formed at the same time.

Figure 7:
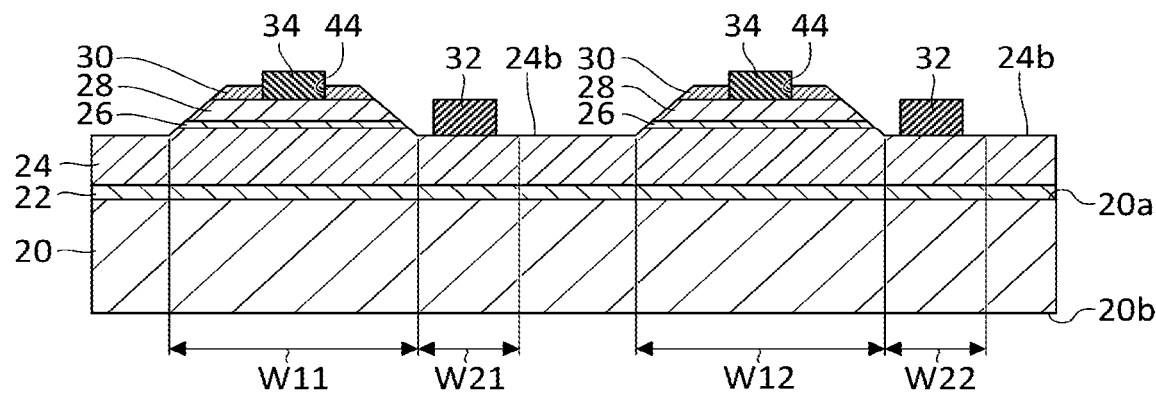
FIG. 7 schematically shows a step of manufacturing the semiconductor light emitting element.

Subsequently, as shown in FIG. 7, a portion of the protective layer 30 is removed to form the first p-side opening 44, and the p-side contact electrode 34 is formed in the first p-side opening 44. The first p-side opening 44 is formed to extend through the protective layer 30, and the protective layer 30 is removed to expose the p-type semiconductor layer 28 in the first p-side opening 44. It is preferred that the protective layer 30 be removed by wet etching. The protective layer 30 can be removed by using, for example, buffered hydrofluoric acid (BHF) that is a liquid containing a mixture of hydrofluoric acid (HF) and ammonium fluoride ($NH_4F$). Wet-etching of the protective layer 30 reduces a damage impact on the p-type semiconductor layer 28 exposed after the protective layer 30 is removed, as contrasted with the case of dry-etching. The p-side contact electrode 34 is formed to be directly in contact with the p-type semiconductor layer 28 exposed in the first p-side opening 44. The p-side contact electrode 34 is, for example, an ITO layer and can be formed by sputtering or electron beam (EB) deposition.

Figure 8:
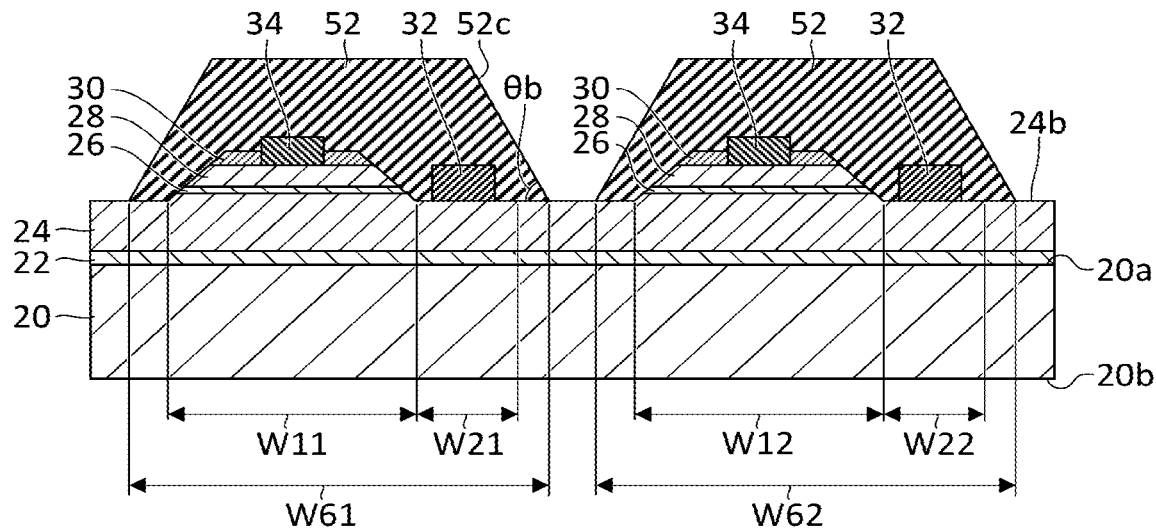
FIG. 8 schematically shows a step of manufacturing the semiconductor light emitting element.

A second resin resist 52 is then formed as shown in FIG. 8. The second resin resist 52 is an etching mask for forming the second mesa surface 14. The second resin resist 52 is provided in regions W61, W62 corresponding to the sixth region W6 of FIG. 1. The region W6 is a range corresponding to the totality of the first region W1, the second region W2, and the third region W3 and is a region inward of the outer circumference 14a of the second mesa surface 14 shown in FIG. 2. The second resin resist 52 is provided on the second upper surface 24b of the n-type semiconductor layer 24, the active layer 26, the p-type semiconductor layer 28, the protective layer 30, the n-side contact electrode 32, and the p-side contact electrode 34.

A second side surface 52c of the second resin resist 52 is sloped at a predetermined slope angle θb with respect to the substrate 20. The slope angle θb of the second side surface 52c of the second resin resist 52 is defined such that the second mesa surface 14 at the second angle θ2 is formed in the subsequent etching step. The slope angle θb of the second side surface 52c of the second resin resist 52 is larger than the slope angle θa of the first side surface 51c of the first resin resist 51. For example, by the configuring the post-baking temperature for the second resin resist 52 to be lower than the post-backing temperature for the first resin resist 51, the second resin resist 52 having the second side surface 52c with a relatively large slope angle θb can be formed.

Figure 9:
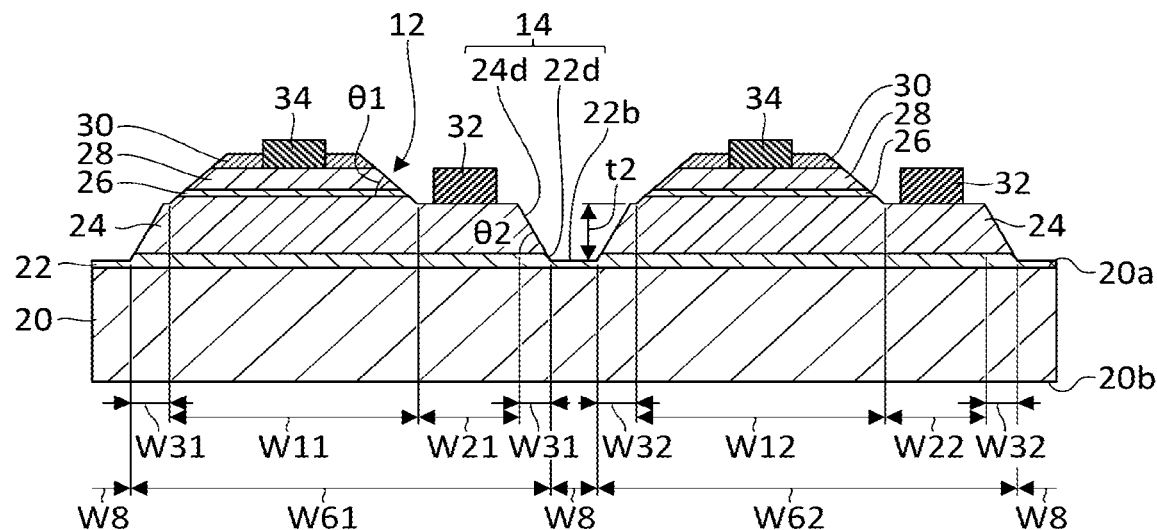
FIG. 9 schematically shows a step of manufacturing the semiconductor light emitting element.

Subsequently, as shown in FIG. 9, the base layer 22 in an eighth region W8 not overlapping the second resin resist 52 (i.e., a region different from the regions W61, W62) is exposed by dry-etching the n-type semiconductor layer 24 from above the second resin resist 52. In this way, the second upper surface 22b of the base layer 22 is formed. Further, the second mesa surface 14 sloped at the second angle θ2 in the regions W61, W62 overlapping the second resin resist 52 is formed. The second mesa surface 14 is comprised of the sloped surface 22d of the base layer 22 and the second sloped surface 24d of the n-type semiconductor layer 24. Regions W31, W32 in which the second mesa surface 14 is formed correspond to the third region W3 of FIG. 1 and are regions different from the first region W1 (W11, W12) in which the active layer 26 is provided and from the second region W2 (W21, W22) in which the n-side contact electrode 32 is provided. The regions W31, W32 in which the second mesa surface 14 is formed is a frame-shaped region inward of the regions W61, W62 overlapping the second resin resist 52 and adjacent to the outer circumference of the regions W61, W62.

For example, reactive ion etching using an etching gas turned into a plasma can be used in the step of forming the second mesa surface 14, as in the step of forming the first mesa surface 12. For example, inductive coupling plasma (ICP) etching may be used. An etching depth t2 in the step of dry-etching from above the second resin resist 52 to form the second mesa surface 14 is, for example, about 1 µm-3 µm. The etching depth t2 for forming the second mesa surface 14 is larger than the etching depth t1 for forming the first mesa surface 12.

Figure 10:
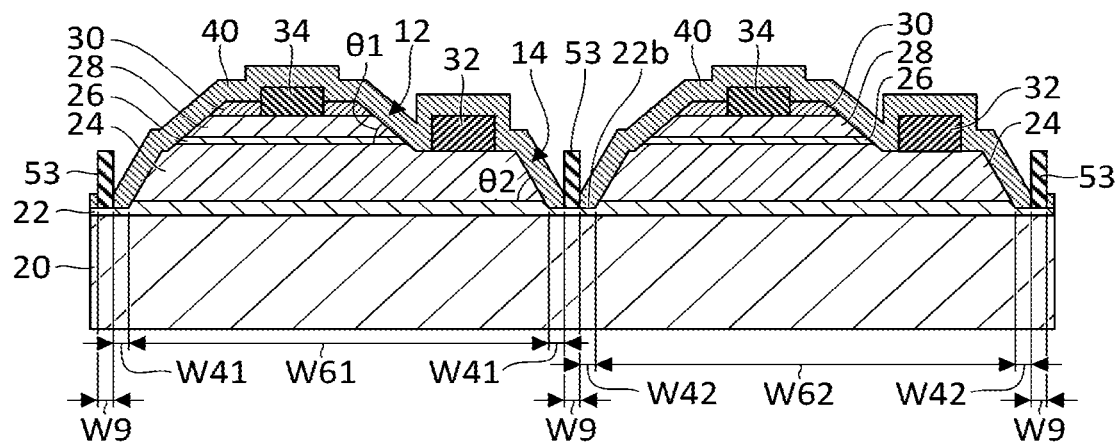
FIG. 10 schematically shows a step of manufacturing the semiconductor light emitting element.
Figure 11:
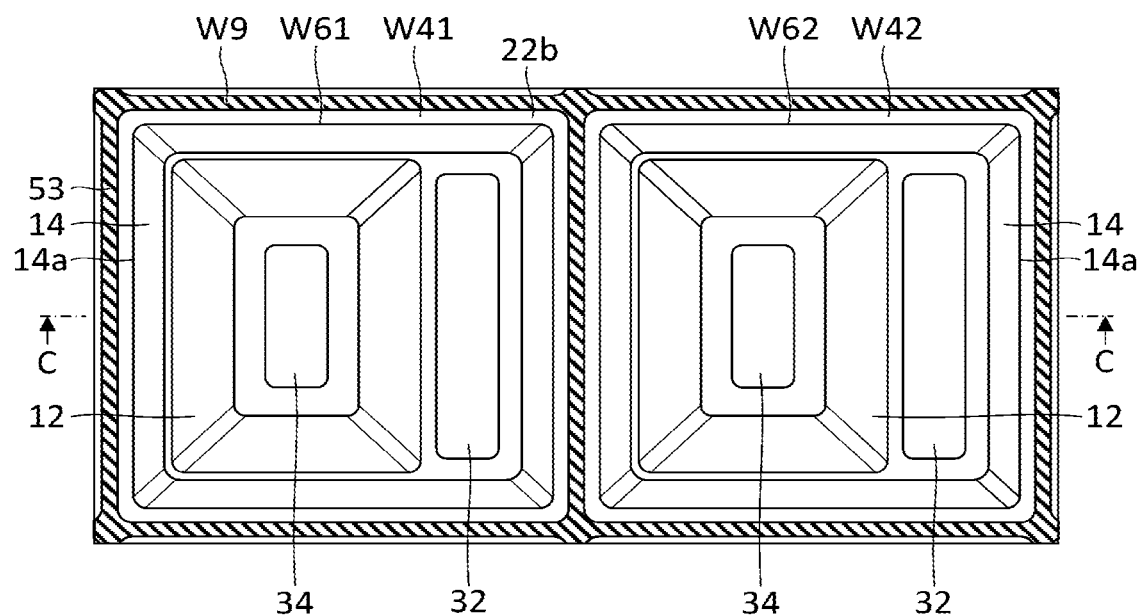
FIG. 11 schematically shows a step of manufacturing the semiconductor light emitting element.

Subsequently, as shown in FIG. 10, a third resin resist 53 is formed on a part of the second upper surface 22b of the base layer 22, and the covering layer 40 is formed by using the third resin resist 53 as a mask. The third resin resist 53 is provided in a ninth region W9 outside regions W41, W42 corresponding to the region W4 of FIG. 1. The ninth region W9 is an isolation region for cutting the substrate 20 off into individual die pieces. FIG. 11 is a top view showing the ninth region W9 in which the third resin resist 53 is formed, and FIG. 10 corresponds to a C-C cross section of FIG. 11. FIG. 11 shows a state occurring before the covering layer 40 is formed. The third resin resist 53 is provided to encircle the outer circumference 14a of the second mesa surface 14, avoiding the frame-shaped regions W41, W42 adjacent to the outer circumference 14a of the second mesa surface 14. The third resin resist 53 may not be a resin and may be a metal mask made of a metal.

As shown in FIG. 10, the covering layer 40 is formed on the entire regions except for the ninth region W9 in which the third resin resist 53 is provided. The covering layer 40 is formed in the regions W41, W42 corresponding to the fourth region W4 of FIG. 1 and in the regions W61, W62 corresponding to the region W6 of FIG. 1. The covering layer 40 covers the first mesa surface 12 and the second mesa surface 14 and also covers the n-side contact electrode 32 and the p-side contact electrode 34. After the covering layer 40 is formed, the third resin resist 53 is removed.

Figure 12:
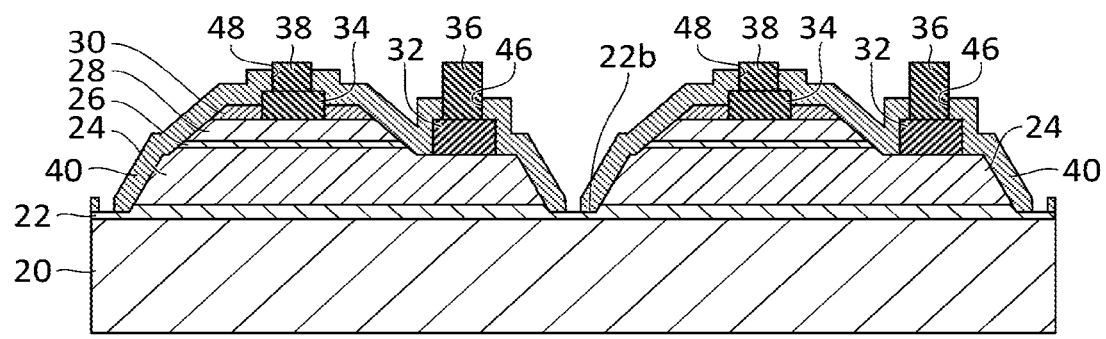
FIG. 12 schematically shows a step of manufacturing the semiconductor light emitting element.

Subsequently, as shown in FIG. 12, a portion of the covering layer 40 is removed to form the n-side opening 46 and the second p-side opening 48 that extend through the covering layer 40, and the n-side pad electrode 36 and the p-side pad electrode 38 are formed. The n-side opening 46 and the second p-side opening 48 can be formed by dry-etching the covering layer 40. The pad electrodes 36, 38 can be formed by, for example, building a Ni layer or a Ti layer and building an Au layer thereon. A further metal layer may be provided on the Au layer. For example, an Sn layer, an AuSn layer, or a stack structure of Sn/Au may be formed.

Figure 13:
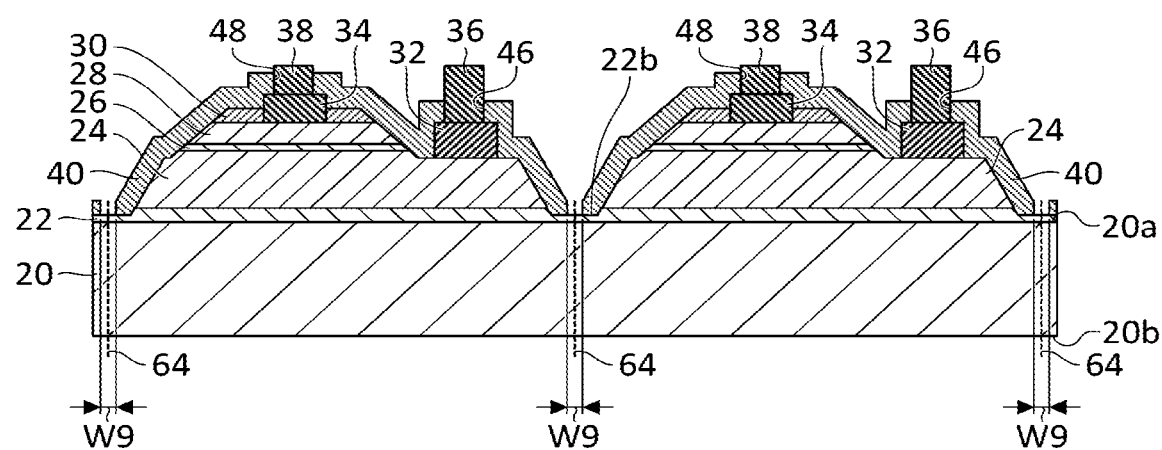
FIG. 13 schematically shows a step of manufacturing the semiconductor light emitting element.

Subsequently, as shown in FIG. 13, individual die pieces are produced by cutting the substrate 20 and the base layer 22 off in the ninth region (isolation region) W9 along a broken line 64. In an exemplary step of cutting the substrate 20 and the base layer 22, the ninth region W9 is first irradiated by a laser from the second principal surface 20b of the substrate 20 so as to form a reformed part for facilitating the cutting of the substrate 20 inside the substrate 20. Subsequently, the base layer 22 and the substrate 20 are cut by thrusting a blade from the top of the base layer 22 toward the substrate 20. The ninth region W9 occurring after the cutting-off corresponds to the fifth region W5 of FIG. 1. The semiconductor light emitting element 10 shown in FIG. 1 is completed through the steps described above.

A description will now be given of the advantage provided by the embodiment. According to the embodiment, the light extraction efficiency is enhanced by causing the deep ultraviolet light emitted from the active layer 26 in the horizontal direction to be reflected by the first mesa surface 12 which is sloped at the first angle θ1 and to be guided toward the second principal surface 20b of the substrate 20. In particular, the light extraction efficiency can be enhanced more suitably by configuring the first angle θ1 of the sloped surface 26c of the active layer 26 to be not less than 40 degrees and less than 55 degrees.

According to the embodiment, the stress applied to the covering layer 40 covering the second mesa surface 14 can be mitigated and the covering layer 40 can be prevented from being damaged, by sloping the second mesa surface 14, which has a large thickness, at the second angle θ2 instead of forming the second mesa surface 14 to be perpendicular to the substrate 20. According to our knowledge, the covering layer 40 could be easily cracked or exfoliated near the outer circumference 40a of the covering layer 40, if the second angle θ2 is 70 degrees or larger. By configuring the second angle θ2 of the second mesa surface 14 to be less than 70 degrees in the embodiment, a damage to the covering layer 40 can be inhibited, and the n-type semiconductor layer 24, the active layer 26, and the p-type semiconductor layer 28 in which an electric current flows while the semiconductor light emitting element 10 emits light are suitably encapsulated. This enhances the reliability of the semiconductor light emitting element 10.

According to the embodiment, the area of the second upper surface 24b of the n-type semiconductor layer 24 can be increased by configuring the second angle θ2 of slope of the second mesa surface 14 to be larger than the first angle θ1 of slope of the first mesa surface 12. This increases the area occupied by the active layer 26 and the area occupied by the n-side contact electrode 32 and enhances the light emission efficiency per a unit area of the substrate 20.

In the embodiment, the entirety of the exposed surface of the n-type semiconductor layer 24 (the second upper surface 24b, the first sloped surface 24c, and the second sloped surface 24d) is covered by the covering layer 40 by forming the second mesa surface 14 until the second upper surface 22b of the base layer 22 is exposed. This inhibits degradation of the n-type semiconductor layer 24 associated with the use of the semiconductor light emitting element 10 and suitably prevents the light emission efficiency from being lowered.

In the embodiment, the covering layer 40 is suitably prevented from being damaged in the process of cutting the substrate 20, by configuring the covering layer 40 not to overlap the base layer 22 in the direction of thickness at the outer circumference of the base layer 22 and exposing the outer circumferential surface 22c of the base layer 22. If the covering layer 40 is provided as far as the outer circumference of the base layer 22, the covering layer 40 should also be cut in the isolating step of FIG. 13, with the result that the covering layer 40 is easily cracked or exfoliated at the outer circumference thereof when the covering layer 40 is cut. According to the embodiment, the covering layer 40 is not cut when individual die pieces are produced so that the highly reliable covering layer 40 is provided.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:

1. A semiconductor light emitting element comprising:
   a base layer made of the AlGaN-based semiconductor material provided on a substrate, the base layer having an n-type impurity concentration of $5 \times 10^{17}$ cm$^{-3}$ or lower,
   an n-type semiconductor layer made of an n-type aluminum gallium nitride (AlGaN)-based semiconductor material provided on the base layer;
   an active layer made of an AlGaN-based semiconductor material provided on the n-type semiconductor layer;
   a p-type semiconductor layer provided on the active layer; and
   a covering layer made of a dielectric material that covers the n-type semiconductor layer, the active layer, and the p-type semiconductor layer, wherein
   each of the active layer and the p-type semiconductor layer has a sloped surface that is sloped at a first angle with respect to the substrate and is covered by the covering layer,
   the n-type semiconductor layer has a sloped surface that is sloped at a second angle larger than the first angle with respect to the substrate and is covered by the covering layer, and
   the base layer has a sloped surface and an upper surface provided outside the sloped surface, wherein the sloped surface is sloped at the second angle with respect to the substrate and is covered by the covering layer, and wherein the upper surface has a first region covered by the covering layer and a second region positioned outside the first region and not covered by the covering layer.

2. The semiconductor light emitting element according to claim 1, wherein
   the first angle is not less than 40 degrees and less than 55 degrees, and the second angle is not less than 55 degrees and less than 70 degrees.

3. The semiconductor light emitting element according to claim 1, wherein
   a thickness of a portion of the n-type semiconductor layer sloped at the second angle is larger than a total thickness of portions of the active layer and the p-type semiconductor layer sloped at the first angle.

4. The semiconductor light emitting element according to claim 1, wherein
   the covering layer does not overlap the base layer in a direction of thickness at an outer circumference of the base layer.

* * * * *